United States Patent
Guo et al.

(10) Patent No.: US 11,002,817 B2
(45) Date of Patent: May 11, 2021

(54) MOTION TRACKING METHOD IN MAGNETIC RESONANCE IMAGING, COMPUTER PROGRAM, AND STORAGE DEVICE

(71) Applicant: GENERAL ELECTRIC COMPANY, Schenectady, NY (US)

(72) Inventors: Jia Guo, Beijing (CN); Yongchuan Lai, Beijing (CN); Xuan Liu, Beijing (CN)

(73) Assignee: General Electric Company, Schenectady, NY (US)

( * ) Notice: Subject to any disclaimer, the term of this patent is extended or adjusted under 35 U.S.C. 154(b) by 315 days.

(21) Appl. No.: 16/212,889

(22) Filed: Dec. 7, 2018

(65) Prior Publication Data

US 2019/0178967 A1    Jun. 13, 2019

(30) Foreign Application Priority Data

Dec. 11, 2017   (CN) .......................... 201711308151.3

(51) Int. Cl.
  *G01R 33/60*   (2006.01)
  *G01R 33/567*  (2006.01)
  *G01R 33/56*   (2006.01)

(52) U.S. Cl.
  CPC ..... *G01R 33/5676* (2013.01); *G01R 33/5608* (2013.01)

(58) Field of Classification Search
CPC combination set(s) only.
See application file for complete search history.

(56) References Cited

U.S. PATENT DOCUMENTS

| | | | |
|---|---|---|---|
| 9,138,162 B2* | 9/2015 | Stemmer ................. | A61B 5/055 |
| 2010/0054570 A1* | 3/2010 | Lamerichs ....... | G01R 33/56509 |
| | | | 382/131 |
| 2011/0152668 A1* | 6/2011 | Stemmer ............ | G01R 33/5676 |
| | | | 600/413 |
| 2014/0039299 A1* | 2/2014 | Foo ....................... | G01R 33/287 |
| | | | 600/417 |
| 2015/0362571 A1* | 12/2015 | Le Fur ................. | G01R 33/465 |
| | | | 324/309 |

* cited by examiner

*Primary Examiner* — Jermele M Hollington
*Assistant Examiner* — Taqi R Nasir

(57) ABSTRACT

Embodiments of the present invention provide a motion tracking method for MR imaging, comprising: exciting an imaging volume of a detected object; shifting a frequency of an FID signal generated by the imaging volume relative to a center frequency as a position of the imaging volume changes; acquiring the FID signal and calculating a frequency shift of the acquired FID signal relative to the center frequency for multiple times; and obtaining a motion trajectory of the detected object in accordance with a change of the frequency shift as a function of time.

16 Claims, 4 Drawing Sheets

MOTION TRACKING METHOD IN MAGNETIC RESONANCE IMAGING, COMPUTER PROGRAM, AND STORAGE DEVICE

CROSS REFERENCE

The present application claims priority and benefit of Chinese Patent Application No. 201711308151.3 filed on Dec. 11, 2017, which in incorporated herein by reference in its entirety.

FIELD

The present disclosure relates to the field of medical detection, particularly to a motion tracking method for magnetic resonance imaging (MRI).

BACKGROUND

When magnetic resonance (MR) technology is utilized to image organs of a human body such as chest, abdomen and the like, image artifacts generated due to a patient's respiratory motion may usually appear, which would affect a doctor's diagnosis on these organs. In order to remove or reduce the respiratory motion artifacts, usually the respiratory motion needs to be monitored in real time, such that imaging data can be acquired at a specific stage (e.g., at the end of expiration) of the respiratory motion using a respiratory triggering/gating technology.

In the prior art, one method is to monitor the respiratory motion with an external monitoring device, and determine when to acquire image data according to the real-time monitoring result. Such a method has the following disadvantages: increasing time for the device setup; requiring more time for posing the patient; adding extra device cost.

Another method is to analyze the respiratory motion based on tracking a position of a small region that is selected by the user to cover a boundary of the organ. Such a method needs no extra device and may achieve tracking of the position of the region by adding a corresponding navigation sequence in a pulse sequence. However, the method still has some problems such that it needs to be improved, for example: the user needs to select a position to be tracked, which is not advantageous for simplifying the process; a repetition time (TR) of the navigation sequence is longer, and a resolution of the motion detection is low; an excitation pulse with a greater flip angle is adopted, which has a risk of saturation.

There is still another method, in which a navigation sequence is adopted to excite layers of an imaging studying volume and generate two navigation echoes successively, and a motion signal representing a motion trajectory is generated by calculating a phase difference between the two navigation echoes. Apparently, such a method needs to acquire at least two echoes.

Therefore, it is necessary to seek for a new method for tracking the respiratory motion, which can solve at least one of the above technical problems, for example, to simplify the process, to shorten TR of the navigation sequence, to reduce the saturation risk, and so on.

SUMMARY

An objective of the present disclosure is to provide a motion tracking method for MR imaging which can simplify the process, shorten TR of the navigation sequence, reduce the saturation risk, and simplify the calculation.

Embodiments of the present disclosure provide a motion tracking method for MR imaging, comprising:
exciting an imaging volume of a detected object;
shifting a frequency of a free induction decay (FID) signal generated by the imaging volume relative to a center frequency as a position of the imaging volume changes;
acquiring the FID signal and calculating a frequency shift of the acquired FID signal relative to the center frequency for multiple times; and
obtaining a motion trajectory of the detected object in accordance with a change of the frequency shift as a function of time.

The exemplary embodiments of the present disclosure also provide a computer program, which, when executed in an MR imaging system, causes the MR imaging system to carry out the above motion monitoring method.

The exemplary embodiments of the present disclosure further provide a storage device for storing the computer program as mentioned above.

Other features and aspects will become apparent from the following detailed description, the drawings, and the claims.

BRIEF DESCRIPTION OF THE DRAWINGS

The disclosure may be better understood by the description of the exemplary embodiments of the present disclosure in conjunction with the accompanying drawings, in which.

DETAILED DESCRIPTION

In the following, specific embodiments of the present disclosure will be described. It should be noted that, in the detailed description of these embodiments, all features of the actual embodiments may not be described in detail for conciseness and simplicity of the description. It should be understood, in actual implementation of any one of the embodiments, just as in any one engineering project or designing project, in order to achieve the developers' specific goals and in order to meet system-related or business-related restrictions, a variety of concrete decisions are often made, and this varies from one implementation to another. In addition, it should also be understood, although the effort made in such developing process may be complex and time-consuming, some variations such as design, manufacture and production on the basis of the technical contents disclosed in the disclosure are just customary technical means in the art for one of ordinary skilled in the art associated with the contents disclosed in the present disclosure, which should not be regarded as insufficient disclosure of the present disclosure.

Unless otherwise defined, all technical or scientific terms used in the claims and the description should be interpreted in the ordinary sense to one of ordinary skills in the art to which this invention belongs. The terms "first," "second"

and the like in the Description and the Claims of the present utility model do not mean any sequential order, number or importance, but are only used for distinguishing different components. The terms "a," "an" and the like do not denote a limitation of quantity, but denote the existence of at least one. The terms "comprises," "comprising," "includes," "including" and the like mean that the element or object in front of the "comprises," "comprising," "includes" and "including" covers the elements or objects and their equivalents illustrated following the "comprises," "comprising," "includes" and "including," but do not exclude other elements or objects. The term "coupled" or "connected" or the like is not limited to being connected physically or mechanically, nor limited to being connected directly or indirectly.

First Embodiment

Figure 1:
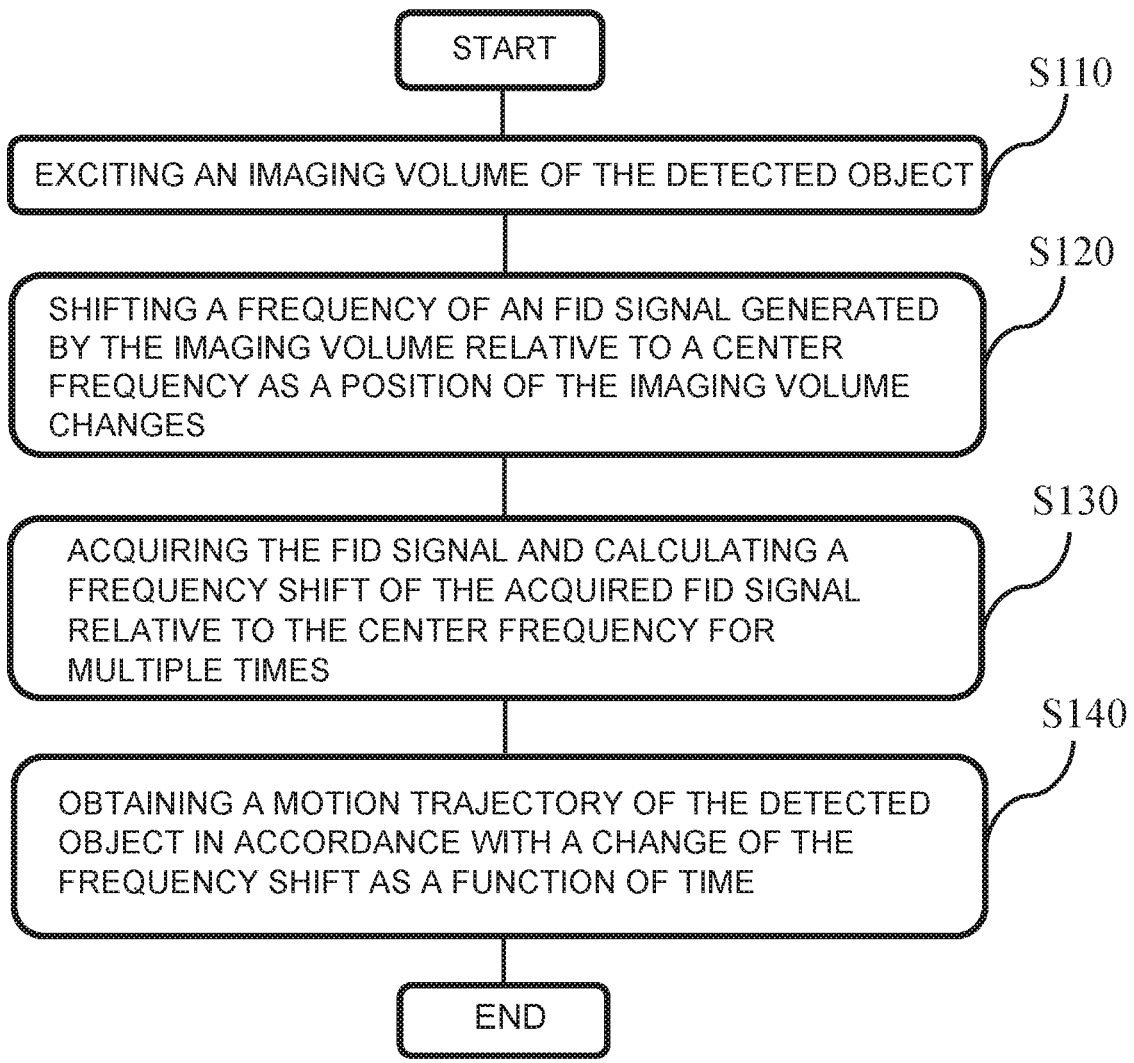
FIG. 1 is a flow chart of a motion tracking method for MR imaging in accordance with a first embodiment and a second embodiment of the present disclosure.
Figure 2:
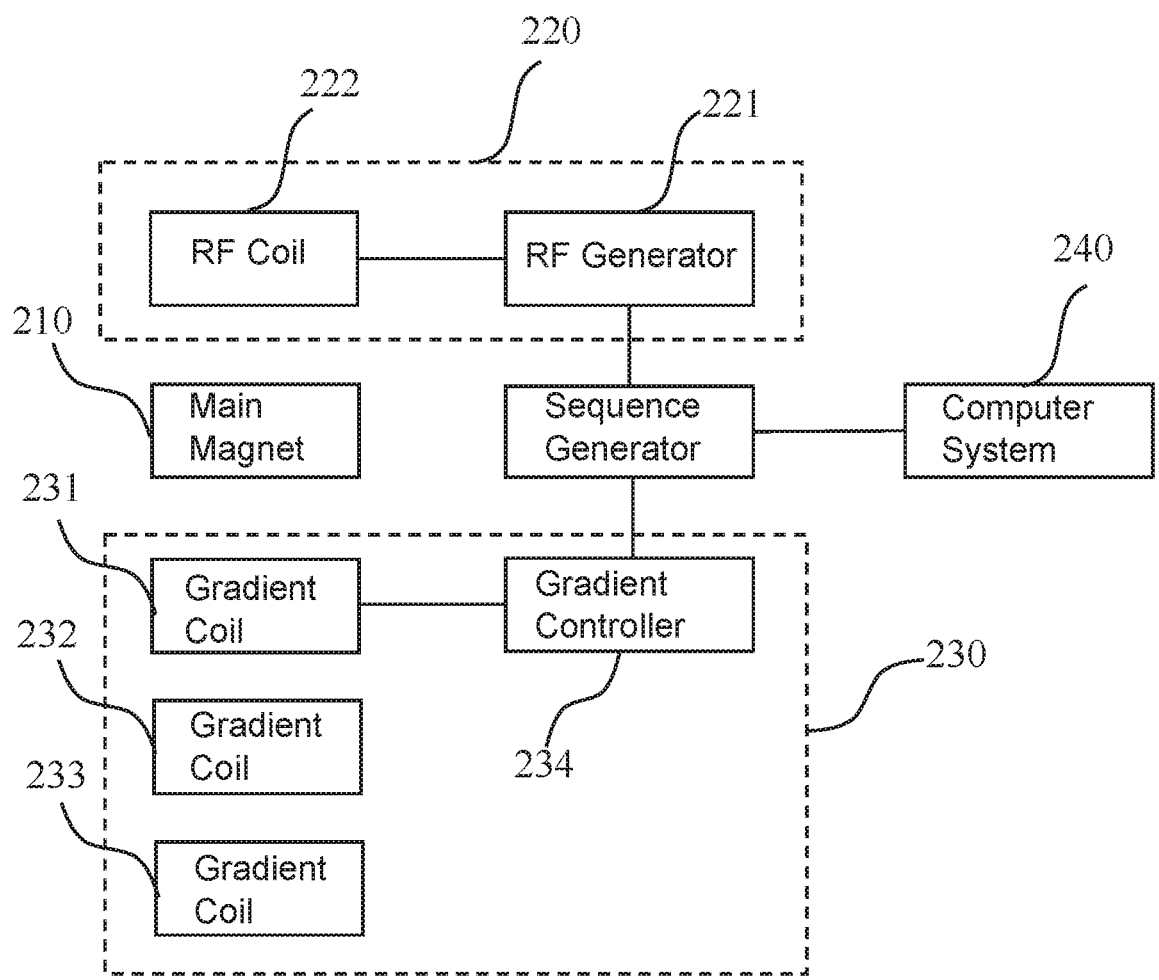
FIG. 2 is a block diagram of an MR imaging system in accordance with an exemplary embodiment.

FIG. 1 is a flow chart of a motion tracking method for MR imaging in accordance with a first embodiment and a second embodiment of the present disclosure, in which the method may be carried out by an MR imaging system; FIG. 2 is a block diagram of an MR imaging system in accordance with an exemplary embodiment.

As shown in FIG. 2, the above MR imaging system comprises a main magnet 210, a radio frequency (RF) system 220, a gradient system 230 and a computer system 240. A hollow portion of the main magnet 210 forms a scanning cavity. A carrying bed for carrying a detected object (e.g., human body) can enter the scanning cavity so as to perform MR imaging on the detected object. A static magnetic field B0 generated by the main magnet 210 causes the detected object in the scanning cavity to generate a longitudinal macro magnetization vector.

The RF system 220 comprises an RF generator 221 and an RF coil 222. The RF coil 222 may comprise an RF transmit coil and an RF receive coil. The RF generator 221 is used to emit an RF excitation pulse to the RF transmit coil to excite the longitudinal magnetization vector of the detected object to flip, thereby generating a transverse magnetization vector. After the RF excitation pulse ends, the transverse magnetization vector decays spirally about an outer magnetic field at a fixed angular frequency to generate an FID signal. By acquiring and analyzing the FID signal, the RF coil may generate an MR signal for imaging the detected object. The RF receive coil may be used to receive the FID signal.

The gradient system comprises gradient coils 231, 232 and 233 arranged in different directions (e.g., in upper-lower, left-right and anterior-posterior directions of the human body, corresponding to Z-axis, X-axis and Y-axis of a reconstruction coordinate) and a gradient controller 234. The gradient controller 234 is used to emit gradient pulses to the gradient coils 231, 232 and 233 to linearly superimpose a gradient magnetic field on the static magnetic field, achieving space localization for the MR signal, allowing generation of an MR image for any slice or volume.

The computer system 240 is, on one hand, used to generate a pulse control sequence. The pulse control sequence is transmitted to the RF generator, the gradient controller, etc. via a sequence generator such that the RF generator, the gradient controller, etc. respectively perform an RF timing sequence and a gradient timing sequence in the pulse control sequence and the MR signal is acquired at a specific period of time of the timing sequences. The computer system 240 is, on the other hand, also used to perform spatial gradient coding on the acquired MR signal for image reconstruction.

Generally speaking, when a certain imaging volume (or imaging slice) is excited, if the outer magnetic field in which the imaging volume lies is not equal to the static magnetic field B0, the acquired FID signal would have a frequency shift linearly as the position changes. The present disclosure is intended to make use of such a phenomenon to analyze a motion trajectory of the detected object by mapping a frequency shift change of the FID signal of the imaging volume or imaging slice to the position change of the imaging volume.

As shown in FIG. 1, the motion tracking method comprises steps S110, S120, S130, and S140.

In the step S110, an imaging volume of the detected object is excited. A person skilled in the art should understand that the imaging volume may be a three-dimensional volume formed of human body voxels. For a thinner imaging volume, it may also be referred to as an imaging slice.

In the step S120, a frequency of an FID signal generated by the above imaging volume is shifted relative to a center frequency as a position of the imaging volume changes. The above center frequency means a precession frequency of an excited human body tissue when the excited human body tissue is in a static magnetic field B0. The center frequency is also called Larmor frequency.

In the step S130, the above FID signal is acquired and a frequency shift of the acquired FID signal relative to the center frequency is calculated for multiple times.

In the step S140, a motion trajectory of the detected object is obtained based on a change of the frequency shift as a function of time.

Optionally, the method of the present embodiment may track the motion trajectory of the detected object by performing a navigation sequence, and in combination with an imaging sequence, achieve gating or triggering of the motion. A person skilled in the art should understand that like the imaging sequence, the navigation sequence also has a plurality of TRs, each having the same timing sequence. As an example, the imaging sequence in the prior art may comprise an RF excitation pulse, a slice selective gradient, a phase coding gradient and a frequency coding gradient set in accordance with a preset timing sequence. In one example, when the RF excitation pulse and the slice selective gradient are applied simultaneously, a human body tissue of a specific imaging volume may be excited to generate a transverse macro magnetization vector, and after the RF excitation pulse ends, the transverse macro magnetization vector decays to generate an FID signal. For imaging sequences in different applications, pulses or gradients for other specific purposes are also included, e.g., RF recovery pulse and so on. The MR image signal (e.g., echo) acquired during performance of the imaging sequence may be used for image reconstruction.

In the present embodiment, one TR of navigation sequence may be embedded within each TR of the imaging sequence. Such a manner may be applied to motion gating. For instance, in one example, if the navigation signal (motion trajectory of the detected object that has been tracked) acquired within the present TR of the imaging sequence shows that the detected object is in an inspiration stage (a non-signal-acquisition stage preset by the user), the image signal acquired within the present TR will be abandoned; while if the navigation signal (motion trajectory of the detected object that has been tracked) acquired within the present TR of the imaging sequence shows that the detected object is in an expiration stage (a signal-acquisition stage preset by the user), the image signal acquired within the present TR may be used for the subsequent image reconstruction.

Figure 3:
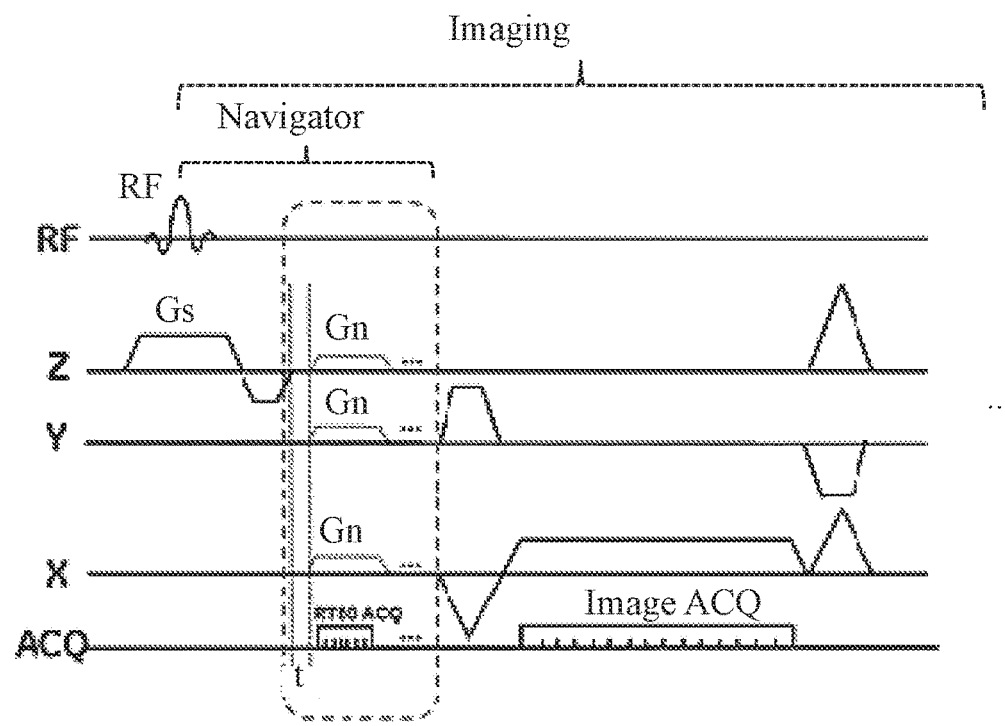
FIG. 3 is an example graph of pulse control sequences adopted in the first embodiment of the present disclosure.

FIG. 3 is an example graph of the navigation sequence and the imaging sequence in which the navigation sequence locates, in accordance with the first embodiment of the present disclosure. Combining FIG. 1 with FIG. 3, it is shown that specifically, in the step S110, an imaging volume of the detected object may be excited by emitting an RF excitation pulse 'RF' and a slice selective gradient Gs; in the step S120, the frequency of the FID signal generated by the imaging volume is shifted relative to the center frequency as the position of the imaging volume changes by emitting a navigation gradient Gn after the RF excitation pulse 'RF' and the slice selective gradient Gs ends.

Thus, it can be seen that in the present embodiment, a navigation sequence is embedded in the imaging sequence and the navigation sequence has a navigation gradient Gn, such that a position change in the gradient of the excited human body tissue can be expressed by a frequency characteristic variation of the FID signal (when the excited tissue slice moves to different positions, the intensities of the gradient magnetic field in which the tissue slice lies will be different), and then the motion trajectory can be tracked, which will be described in details below.

As mentioned above, with an outer magnetic field having a fixed intensity, the FID signal is precesses at a fixed angular velocity. Therefore, if the calculated frequency of the FID signal shifts relative to the center frequency, it indicates that the intensity of the outer magnetic field in which the exited imaging volume lies changes relative to the intensity of the main magnetic field B0, and the extent of the change is in a linear relationship with the shift of the frequency, which may be expressed in the following Equation (1):

$$\Delta f = \gamma G x \qquad (1)$$

In the above equation, $\Delta f$ represents the frequency shift, x is the position of the excited imaging volume, which may be, for example, a position on an X-axis gradient, a Y-axis gradient or a Z-axis gradient, G represents the magnetic field intensity superimposed on the main magnetic field, which represents a rate of change of the intensity of the gradient magnetic field as a function of the position x, for example, the unit of G may be Gauss/cm.

Therefore, the navigation sequence is performed such that the intensity of the outer magnetic field changes linearly. When the excited imaging slice moves to positions of the outer magnetic field with different intensities, the frequency shifts of the frequencies of the FID signals thereby generated relative to the center frequency would also be different. And then in the step S140, the motion trajectory of the detected object may be obtained based on the change of the frequency shift with time (or position). Specifically, the position trajectory of the imaging slice is described by a curve of the change of the frequency shift, thereby tracking the motion.

One TR of the above navigation sequence is marked as 'Navigator' in FIG. 3, and one TR of the above imaging sequence is marked as 'Imaging' in FIG. 3. As shown in FIG. 3, the RF excitation pulse 'RF' and the slice selective gradient Gs in the navigation sequence use the RF excitation pulse 'RF' and the slice selective gradient Gs in the imaging sequence respectively.

The navigation gradient Gn may be emitted within each TR of the imaging sequence, and the FID signal (such as RTBO ACQ in FIG. 3) may be acquired during each navigation gradient Gn. After the navigation gradient Gn ends, the unfinished part, e.g., acquiring the image signal (such as the image signal acquisition pulse 'Image ACQ' in FIG. 3) of the imaging sequence 'Imaging' may continue to be performed. In other words, the navigation gradient pulse Gn is interspersed in the imaging sequence 'Imaging.' For example, the navigation gradient Gn is performed before acquiring the image signal (such as the image signal acquisition pulse 'Image ACQ' in FIG. 3).

Optionally, the above navigation gradient Gn may comprise gradients in one or more directions. The one or more directions may be set to be the directions of the X-axis, Y-axis and/or Z-axis of the coordinate for image reconstruction. As long as the detected object has a motion in a direction of any coordinate axis, the navigation gradient may be applied in the direction of the motion, and thus the tracking of the motion trajectory in any direction of motion can be achieved.

The navigation sequence of the present embodiment is suitable for situations where the time occupied by the navigation sequence has no effect or little effect on the whole imaging sequence. For example, when the time occupied by the navigation sequence is 50 μs, for some types of imaging sequences, said 500 would not cause a problem, e.g., image signal quality degradation. For other types of imaging sequences, if the time occupied by the navigation gradient would cause such a problem, it may be considered not to intersperse the navigation gradient in the imaging sequence, but to separate the navigation gradient from the imaging sequence. Such a manner will be described in detail in the second embodiment.

Optionally, in order to avoid impact by a generated eddy current on the acquired FID signal, in the above navigation sequence, there may be a preset delay time t between the slice selective gradient Gs and its adjacent navigation gradient Gn.

Optionally, the step of "calculating a frequency shift of the acquired FID signal relative to the center frequency" in the step S130 comprises: transforming the FID signal in time domain to a frequency domain signal. For example, the frequency of the FID signal may be obtained by a Fourier transform or other transforming methods, and by subtracting the center frequency under the main magnetic field B0 from said frequency, the frequency shift can be obtained.

In addition, such a navigation sequence as mentioned above enables motion tracking by using an RF excitation pulse with a small flip angle. For example, the flip angle of the RF excitation pulse may be less than 10 degrees, thus having a very small saturation risk.

Second Embodiment

The flow chart of the motion tracking method for MR imaging in accordance with the second embodiment of the present disclosure may be as shown in FIG. 1, the principle and process of which are generally the same as those of the solution of the first embodiment.

Figure 4:
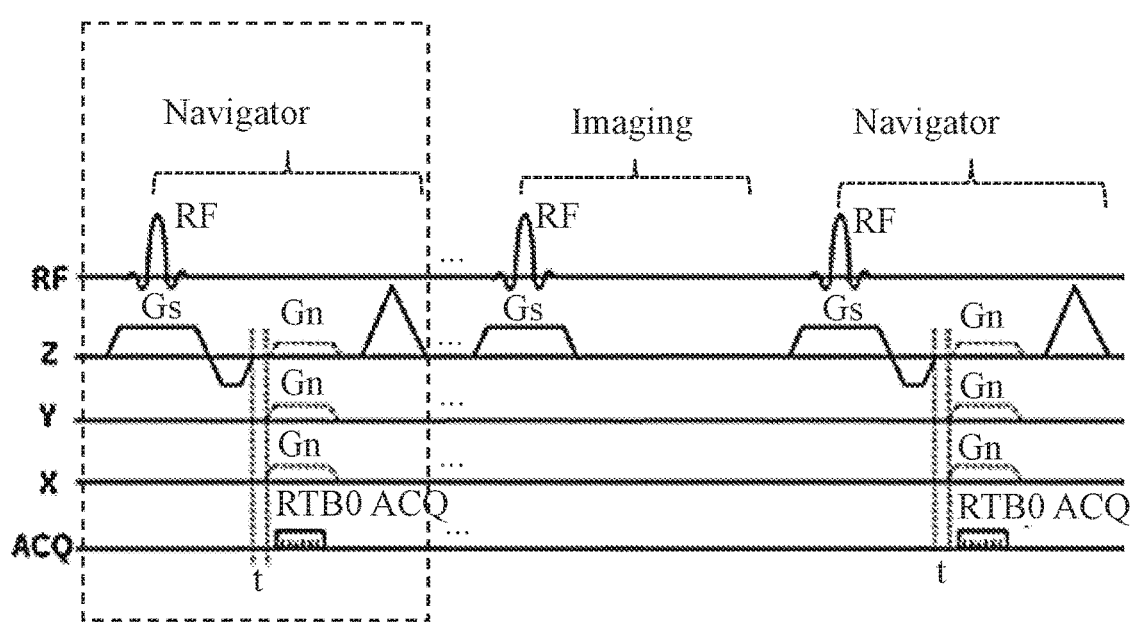
FIG. 4 is an example graph of pulse control sequences adopted in the second embodiment of the present disclosure.

FIG. 4 is an example graph of navigation sequences adopted in the second embodiment of the present disclosure. As shown in FIG. 4, similarly, in the second embodiment, an imaging volume of the detected object is excited by emitting an RF excitation pulse 'RF' and a slice selective gradient Gs, and the frequency of the FID signal generated by the imaging volume is shifted relative to the center frequency as the position of the imaging volume changes by emitting a navigation gradient Gn after the RF excitation pulse 'RF' and the slice selective gradient Gs ends.

The difference between the second embodiment and the first embodiment lies in different timing sequence between the navigation sequence and the imaging sequence, thus applying to different applications.

As shown in FIG. 4, in the embodiment, the navigation sequence 'Navigator' is independent from the imaging sequence 'Imaging.' Specifically, one or more TR of the navigation sequence is performed before each TR of the imaging sequence. The TR of the navigation sequence and the TR of the imaging sequence have separate RF excitation pulse 'RF' and slice selective gradient Gs respectively, and the navigation sequence does not use the RF excitation pulse 'RF' and slice selective gradient Gs of the imaging sequence.

Such a manner may be applied to motion triggering. For instance, in one example, by performing a plurality of TRs of the navigation sequence, the motion trajectory may be detected continuously, and the imaging sequence will not be triggered, i.e., the image signal will not be acquired, until it is detected that the detected object moves to a specific position (e.g., a position at the end of the expiration).

Within each TR of the navigation sequence, an RF excitation pulse 'RF' and a slice selective gradient Gs are emitted first, and a navigation gradient Gn is emitted after the RF excitation pulse 'RF' and the slice selective gradient Gs end, and the FID signal is acquired during the navigation gradient Gn.

Similarly, the navigation gradient Gn may be applied onto one or more direction axes of the coordinate for image reconstruction.

There may be a preset delay time t between a slice selective gradient Gs and its navigation gradient Gn.

Compared with the first embodiment, the navigation sequence and the imaging sequence have separate RF excitation pulse 'RF' and slice selective gradient Gs respectively. In this manner, effect on the imaging sequence may be avoided.

Third Embodiment

The third embodiment of the present disclosure may also provide a computer program, which, when executed in an MR imaging system, causes the MR imaging system to carry out the motion tracking method of the above first embodiment or second embodiment. Specifically, the computer program may run in a computer system of an MR system.

For example, the computer program may comprise the following instructions:

Instruction One: exciting an imaging volume of a detected object;

Instruction Two: shifting a frequency of an FID signal generated by the imaging volume relative to a center frequency as a position of the imaging volume changes;

Instruction Three: acquiring the FID signal and calculating a frequency shift of the acquired FID signal relative to the center frequency for multiple times; and Instruction Four: obtaining a motion trajectory of the detected object based on a change of the frequency shift as a function of time.

The computer program tracks the motion trajectory of the detected object by performing the navigation sequence, in which Instruction One comprises the following sub-instruction: exciting an imaging volume of the detected object by emitting an RF excitation pulse and a slice selective gradient; Instruction Two comprises the following sub-instruction: shifting the frequency of the FID signal generated by the imaging volume relative to the center frequency as the position of the imaging volume changes by emitting a navigation gradient after the RF excitation pulse and the slice selective gradient ends; Instruction Three comprises the following sub-instruction: acquiring the FID signal during the navigation gradient.

Optionally, one TR of the navigation sequence is embedded within each TR of the imaging sequence, in which the navigation sequence uses the RF excitation pulse and the slice selective gradient of the imaging sequence, i.e., performing the above Instruction One to Instruction Four within each TR of the imaging sequence.

Optionally, one or more TR of the navigation sequence is performed before each TR of the imaging sequence, i.e., perform the above Instruction One to Instruction Four for one or more times before performing each TR of the imaging sequence.

Optionally, in Instruction Two, the navigation gradient is applied onto one or more direction axes of the coordinate for image reconstruction.

Optionally, Instruction Five is further comprised: emitting the navigation gradient after a preset delay time after the slice selective gradient ends, i.e., the preset delay time exists between a slice selective gradient and its navigation gradient.

Optionally, the step of "calculating a frequency shift of the acquired FID signal relative to the center frequency" in Instruction Three comprises: transforming the FID signal in time domain to a frequency domain signal.

Fourth Embodiment

The fourth embodiment of the present disclosure is further to provide a storage device for storing the computer program as mentioned above.

Figure 5:
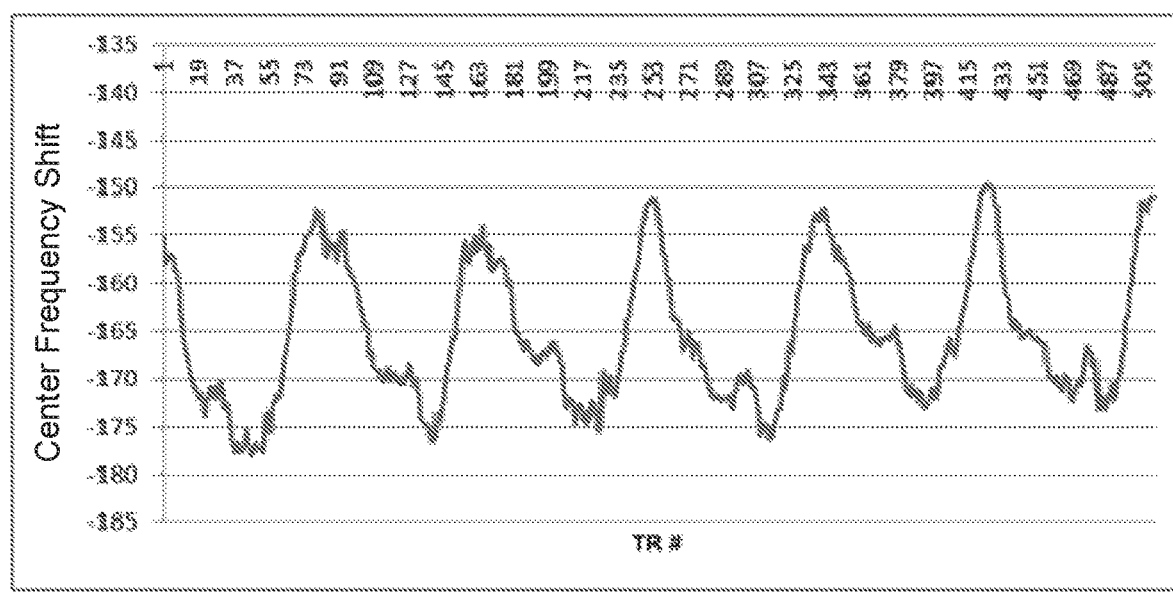
FIG. 5 is a respiratory motion trajectory obtained by utilizing the embodiments of the present disclosure.

FIG. 5 is a respiratory motion trajectory of a volunteer obtained by utilizing the above embodiments of the present invention, which was consistent with the actual respiratory motion trajectory of the volunteer.

In the above embodiments of the present invention, by exciting an imaging volume of the detected object and shifting a frequency of an FID signal generated by the imaging volume relative to a center frequency as a position of the imaging volume changes, a motion trajectory of the detected object is obtained using a change of the frequency shift with time, and the obtained motion trajectory can be used for motion triggering/gating, so as to obtain image data at a specific stage (e.g., at the end of expiration) of the motion for image reconstruction. Compared with the prior art, no extra hardware device is needed; huge cost for setting a certain region at a boundary of an organ as "Tracker" has been avoided, operating process of the user can be simplified; a TR of a navigation sequence is short (in one exemplary experiment, the time required by a complete navigation sequence is less than 50 μs), so a resolution for motion detection is high; and a saturation risk can be avoided, which is brought by an RF excitation pulse with a large flip angle that must be adopted when utilizing the 'Tracker' technology; in addition, the above embodiments may be used for a three-dimensional imaging sequence, and may also be used for a two-dimensional imaging sequence.

Some exemplary embodiments have been described above, however, it should be understood that various modifications may be made. For example, if the described techniques are carried out in different orders, and/or if the components in the described system, architecture, apparatus or circuit are combined in different ways and/or replaced or supplemented by additional components or equivalents thereof, proper results may still be achieved. Accordingly, other implementations also fall within the protection scope of the Claims.

What is claimed is:

1. A motion tracking method for magnetic resonance imaging (MRI), the method comprising:
   exciting an imaging volume of a detected object;
   shifting a frequency of a free induction decay (FID) signal generated by the imaging volume relative to a center frequency as a position of the imaging volume changes;
   acquiring the FID signal and calculating a frequency shift of the acquired FID signal relative to the center frequency for multiple times;
   determining a motion trajectory of the detected object based on a change of the frequency shift with time;
   wherein exciting the imaging volume comprises applying a radio frequency (RF) excitation pulse and a slice selective gradient; and
   wherein shifting the frequency of the FID signal comprises applying a navigation gradient after the RF excitation pulse and the slice selective gradient end.

2. The method of claim 1, wherein a flip angle of the RF excitation pulse is no greater than 10 degrees.

3. The method of claim 1, wherein there is a preset delay between the slice selective gradient and the navigation gradient.

4. The method of claim 1, wherein the FID signal is acquired during the navigation gradient is being applied.

5. The method of claim 1, wherein calculating the frequency shift of the acquired FID signal comprises transforming the FID signal from time domain to frequency domain.

6. The method of claim 1, further comprising:
   acquiring magnetic resonance (MR) signal from the imaging volume;
   determining whether the detected object is at a preset stage of motion based on the motion trajectory; and
   using the acquired MR signal at the preset stage and not the acquired MR signal outside of the preset stage to reconstruct an MR image.

7. The method of claim 1 wherein calculating the frequency shift of the acquired FID signal comprises determining the frequency of the FID signal by a Fourier transform, and by subtracting the center frequency from the frequency of the FID signal.

8. The method of claim 1, further comprising:
   determining whether the detected object is at a preset stage of motion based on the motion trajectory;
   acquiring MR signal from the imaging volume when the detected object is at the preset stage; and
   using the acquired MR signal to reconstruct an MR image.

9. An MRI system comprising:
   an RF coil configured to excite an imaging volume of a detected object;
   one or more gradient coils configured to apply one or more gradients on the imaging volume; and
   a computer system configured to:
      instruct the RF coil to apply a RF excitation pulse to excite the imaging volume;
      instruct the one or more gradient coils to apply a slice selective gradient;
      instruct the one or more gradient coils to apply a navigation gradient to shift a frequency of a free induction decay (FID) signal generated by the imaging volume relative to a center frequency as a position of the imaging volume changes;
      instruct the RF coil to acquire the FID signal for multiple times;
      calculate frequency shifts of the acquired FID signal relative to the center frequency; and
      determine a motion trajectory of the detected object based on a change of the frequency shift with time;
   wherein the navigation gradient is applied after the RF excitation pulse and the slice selective gradient end, and there is a preset delay between the slice selective gradient and the navigation gradient.

10. The MRI system of claim 9, wherein a flip angle of the RF excitation pulse is no greater than 10 degrees.

11. The MM system of claim 9, wherein there is a preset delay between the slice selective gradient and the navigation gradient.

12. The MRI system of claim 9, wherein the computer system is further configured to:
   instruct the one or more gradient coils to apply gradients for imaging;
   instruct the RF coil to acquire MR signal from the imaging volume;
   determine whether the detected object is at a preset stage of motion based on the motion trajectory; and
   use the acquired MR signal at the preset stage and not the acquired MR signal outside of the preset stage to reconstruct an MR image.

13. The MRI system of claim 9, wherein the computer system is further configured to:
   determining whether the detected object is at a preset stage of motion based on the motion trajectory;
   when the detected object is at the preset stage, instruct the one or more gradient coils to apply gradients for imaging;
   instruct the RF coil to acquire MR signal from the imaging volume; and
   use the acquired MR signal to reconstruct an MR image.

14. A non-transitory computer readable medium storing instruction, when executed by an MRI system, cause the MRI system to:
   excite an imaging volume of a detected object;
   shift a frequency of a free induction decay (FID) signal generated by the imaging volume relative to a center frequency as a position of the imaging volume changes;
   acquire the FID signal and calculating a frequency shift of the acquired FID signal relative to the center frequency for multiple times; and
   determine a motion trajectory of the detected object based on a change of the frequency shift with time;
   wherein exciting the imaging volume comprises applying a radio frequency (RF) excitation pulse and a slice selective gradient; and
   wherein shifting the frequency of the FID signal comprises applying a navigation gradient after the RF excitation pulse and the slice selective gradient end.

15. The medium of claim 14 further storing instruction, when executed by the MRI system, cause the MRI system to:
   acquire magnetic resonance signal from the imaging volume;
   determine whether the detected object is at a preset stage of motion based on the motion trajectory; and
   use the acquired MR signal at the preset stage and not the acquired MR signal outside of the preset stage to reconstruct an MR image.

16. The medium of claim 14 further storing instruction, when executed by the MRI system, cause the MRI system to:

determine whether the detected object is at a preset stage of motion based on the motion trajectory;
acquire MR signal from the imaging volume when the detected object is at the preset stage; and
use the acquired MR signal to reconstruct an MR image.

* * * * *